US008304864B2

(12) United States Patent
San Antonio et al.

(10) Patent No.: US 8,304,864 B2
(45) Date of Patent: Nov. 6, 2012

(54) LEAD FRAME ROUTED CHIP PADS FOR SEMICONDUCTOR PACKAGES

(75) Inventors: Romarico Santos San Antonio, Batam Island (ID); Anang Subagio, Batam Island (ID); Shafidul Islam, Plano, TX (US)

(73) Assignee: Unisem (Mauritius) Holdings Limited, Port Louis (MU)

( * ) Notice: Subject to any disclaimer, the term of this patent is extended or adjusted under 35 U.S.C. 154(b) by 207 days.

(21) Appl. No.: 12/843,183

(22) Filed: Jul. 26, 2010

(65) Prior Publication Data

US 2011/0001224 A1 Jan. 6, 2011

Related U.S. Application Data

(63) Continuation-in-part of application No. 10/561,381, filed as application No. PCT/US2004/019523 on Jun. 18, 2004, now Pat. No. 7,795,710.

(60) Provisional application No. 60/482,527, filed on Jun. 25, 2003.

(51) Int. Cl.
*H01L 23/48* (2006.01)

(52) U.S. Cl. ........ 257/666; 257/675; 257/691; 257/692; 257/701; 257/706; 257/735; 257/E23.031

(58) Field of Classification Search ........................ None
See application file for complete search history.

(56) References Cited

U.S. PATENT DOCUMENTS 6,060,768 A * 5/2000 Hayashida et al. ........... 257/666
2001/0018800 A1* 9/2001 Tzanavaras et al. ............ 29/847
2002/0121670 A1* 9/2002 Minamio et al. .............. 257/459

* cited by examiner

*Primary Examiner* — Fei Fei Yeung Lopez
(74) *Attorney, Agent, or Firm* — Wiggin and Dana LLP

(57) ABSTRACT

A redistributed lead frame for use in a molded plastic semiconductor package is formed from an electrically conductive substrate by a sequential metal removal process. The process includes patterning a first side of the substrate to form an array of lands separated by channels; disposing a first molding compound within those channels; patterning a second side of the substrate to form an array of chip attach sites and routing circuits electrically interconnecting the array of lands and the array of chip attach sites; directly electrically interconnecting input/output pads on a semiconductor device to the chip attach sites; and encapsulating the semiconductor device, the array of chip attach sites and the routing circuits with a second molding compound. This process is particularly suited for the manufacture of chip scale packages and very thin packages.

58 Claims, 13 Drawing Sheets

38 28 36 18 24 26

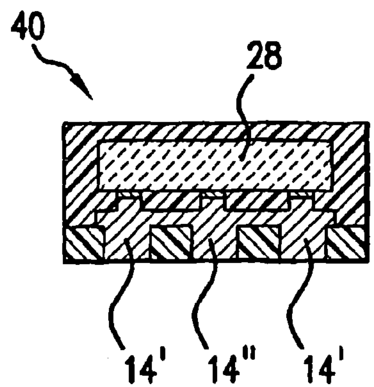
FIG.8
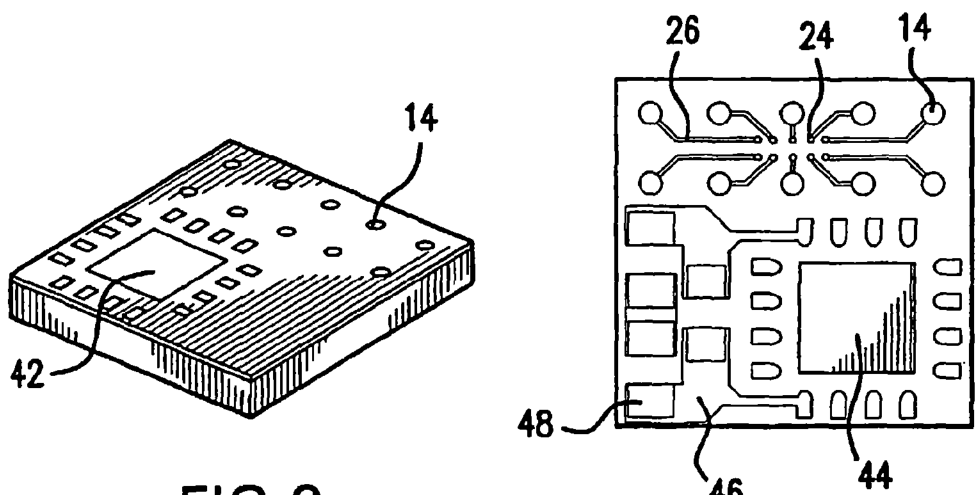
FIG.9
FIG.10
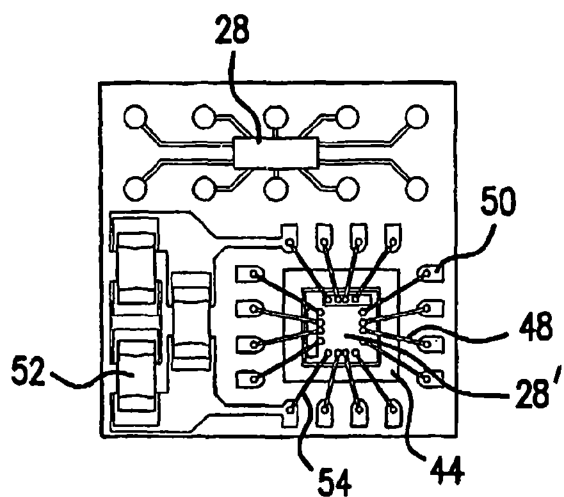
FIG.11

LEAD FRAME ROUTED CHIP PADS FOR SEMICONDUCTOR PACKAGES

CROSS REFERENCE TO RELATED APPLICATIONS

This application is a continuation-in-part of U.S. application Ser. No. 10/561,381, now U.S. Pat. No. 7,795,710, which was the National Stage of International Application No. PCT/US04/19523, filed Jun. 18, 2004, which claims the benefit of U.S. Provisional Application No. 60/482,527, filed Jun. 25, 2003, the disclosures of which are incorporated herein by reference in their entirety.

FIELD OF THE DISCLOSURE

This invention relates to a lead frame for a molded plastic packages of the type that encapsulates one or more semiconductor devices. More particularly, the lead frame is formed by a sequential metal removal process that selectively patterns external lead ends, routing circuits and internal lead ends from a single electrically conductive substrate.

BACKGROUND OF THE DISCLOSURE

One type of package used to encase semiconductor devices is a molded plastic package. The semiconductor device is encased in a block of polymer resin that provides environmental protection. Electrical signals are transmitted between the semiconductor device and external circuitry, such as a printed circuit board ("PCB"), by a number of different electrically conductive structures. In a leaded package, an electrically conductive lead frame has inner lead ends and opposing outer lead ends. The lead frame configuration is typically formed by chemical etching. The pitch of the inner lead ends is limited by etching considerations to about the thickness of the lead frame. As a result, the leads terminate a distance from the semiconductor device and are electrically interconnected to input/output pads on the semiconductor device by small diameter wires. The leads extend outward from the inner lead ends to terminate at outer lead ends that are soldered to contact pads on external circuitry. The footprint (surface area on a printed circuit board or other external structure) occupied by this type of leaded package is significantly greater than the footprint of the semiconductor device.

There is a desire in the semiconductor packaging industry to minimize the footprint of semiconductor packages with a goal to obtain chip-scale packages where the footprint of the package is not greater than the footprint of the semiconductor device. In a leaded package, there is always a sizable difference between the bond-pad pitch at the inner leads and the land-pitch external to the package which is utilized for circuit board attach. The bond-pad pitch trends to achieve finer geometries to maximize the use of silicon real estate, while the circuit board level pitch remains more widely spaced for PCB routing and soldering. The fan-out of the lead frame from chip bond-pad pitch to external land pitch causes the package to occupy a much larger footprint than the semiconductor device. This is contrary to the concept and demand for Chip-Scale-Packaging ("CSP").

The trend towards CSP has driven the evolution of "array" packages with external lands arranged in a grid array at a suitable circuit board-attach pitch. This gird array is constrained within the footprint of the chip. However, this package requires the semiconductor device bond-pads to be routed to desired land positions by use of an interface, often called an interposer. As disclosed in U.S. Pat. No. 6,477,034, the interposer is a multi-layer, usually a thin 2-layer or 3-layer, flexible or similar substrate that enables the pitch fan-out and routing. U.S. Pat. No. 6,477,034 is incorporated by reference in its entirety herein. Interposers are not preferred. In addition to a major cost addition, extra processing steps are required during package assembly.

Ball grid array ("BGA") packages use printed circuit board substrates for circuit routing and for supporting land repositioning within application limitations, that is to compromise technology limitations in routing features/capabilities against board-attach soldering limits To enable dense packaging and positioning of the lands, many BGA substrates utilize multilayer configuration with vias. However, use of such BGA substrates and the addition of vias significantly increase the cost and the processing steps.

A method to manufacture a lead frame for a Quad Flat No-lead ("QFN") package is disclosed in U.S. Pat. No. 6,498,099 to McLellan et al. that is incorporated by reference in its entirety herein. A first side of an electrically conductive substrate is partially etched to define a pad attach and inner lead ends. A semiconductor device is bonded to the partially defined pad attach and electrically interconnected to partially defined inner lead ends by wire bonds or the like. The semiconductor device, partially defined pad attach, partially defined inner leads and wire bonds are then encapsulated in a polymer molding resin. The opposing second side of the electrically conductive substrate is then etched to electrically isolate the pad attach and inner lead ends and to define outer lead ends.

Another method for the manufacture of a QFN package is disclosed in commonly owned U.S. Pat. No. 6,812,552 and is incorporated by reference in its entirety herein. The application that issued as U.S. Pat. No. 6,812,552 was published on Oct. 30, 2003 as United States Patent Application Publication US 2003/0203539 A1.

There remains, however, a need for a method for the manufacture of chip-scale and other semiconductor packages with accurately positioned inner and outer lead ends and routing circuits that do not require complex manufacturing steps or the inclusion of supplemental interposer circuits. Further there remains a need for the packages manufactured by this method.

SUMMARY OF THE DISCLOSURE

In accordance with a first embodiment of the disclosure, there is provided a package for encasing at least one semiconductor device. The package includes a lead frame having opposing first and second sides. The first side of the lead frame has a planar first side surface and an array of lands, a surface of each of the lands comprising a portion of the first side surface; the lands are adapted to be bonded to external circuitry and are arranged in a first pattern. The second side of the lead frame has a planar second side surface and an array of chip attach sites. Each of the chip attach sites comprises a portion of the second side surface. The chip attach sites are arranged in a second pattern and directly electrically interconnected to input/output pads on the semiconductor device. A plurality of electrically isolated routing circuits are on the second side of the lead frame. Each of the routing circuits has a surface comprising a portion of the second side surface and coplanar with the chip attach sites, electrically interconnecting individual combinations of the array of lands and array of chip attach sites. The lands and chip attach sites are formed from a monolithic electrically conductive structure. A first molding compound, disposed at the first side of the lead frame and between individual lands, has a surface comprising a portion of the first side surface. A second molding compound encapsulates the semiconductor device, the array of chip attach sites, and the routing circuits.

According to another embodiment of the disclosure, a package for encasing at least one semiconductor device has a lead frame, chip attach sites, and routing circuits as described above, but the surfaces of the first molding compound are recessed with respect to the planar first side surface. The lands therefore are provided with a stand-off distance between the package and an external printed circuit board.

According to an additional embodiment of the disclosure, a package for encasing at least one semiconductor device has a lead frame, chip attach sites, and routing circuits as described with respect to the first embodiment, except that the chip attach sites are not coplanar with the routing circuits but instead protrude from the second side surface. The increased spacing between the semiconductor device and the routing circuits facilitates the flow of the second molding compound on the underside of the device.

According to a further embodiment of the disclosure, a package for encasing at least one semiconductor device has a lead frame, chip attach sites, and routing circuits as described with respect to the first embodiment, except that the surfaces of the first molding compound are recessed with respect to the planar first side surface so that the lands are provided with a stand-off distance, and the chip attach sites are not coplanar with the routing circuits but instead protrude from the second side surface.

According to still another embodiment of the disclosure, there is provided a package including a lead frame having opposing first and second sides. The first side of the lead frame has a planar first side surface and an array of lands, a surface of each of the lands comprising a portion of the first side surface; the lands are adapted to be bonded to external circuitry and are arranged in a first pattern. The second side of the lead frame has a planar second side surface with a die pad and an array of wirebonding sites. Each of the wirebonding sites may comprise a portion of the second side surface. The wirebonding sites are arranged in a second pattern and directly electrically interconnected to input/output pads on the semiconductor device. A plurality of electrically isolated routing circuits, coplanar with the die pad, are on the second side of the lead frame. Each of the routing circuits has a surface comprising a portion of the second side surface and coplanar with the wirebonding sites, electrically interconnecting individual combinations of the array of lands and array of wirebonding sites. The lands and wirebonding sites are formed from a monolithic electrically conductive structure. A first molding compound, disposed at the first side of the lead frame and between individual lands, has a surface comprising a portion of the first side surface. A second molding compound encapsulates the semiconductor device, the die pad, the array of wirebonding sites, and the routing circuits.

According to an additional embodiment of the disclosure, a package includes a lead frame and wirebonding sites as described just above, but with a non-conductive layer instead of a die pad on the second side of the lead frame. A semiconductor device is disposed on the non-conductive layer, and wirebonding connections are made to the device. At least one of the routing circuits extends beneath the non-conductive layer, and at least one of the lands is located on the first side surface in a portion thereof corresponding to a portion of the second side surface covered by the semiconductor device, so that at least one electrical conductor extends from the first side surface to the second side surface beneath the semiconductor device and electrically connects to the routing circuit extending beneath the non-conductive layer.

In accordance with these embodiments, chip-scale packages and packages to encase multiple devices are readily provided. In addition, the lead frame may be formed from a monolithic electrically conductive structure and supported by the first molding compound. This causes the lead frame to be robust and have few problems relating to loss of coplanarity.

Details of various embodiments of the invention are set forth in the accompanying drawings and the description below. Other features, objects and advantages of the invention will be apparent from the description and drawings, and from the claims.

BRIEF DESCRIPTION OF THE DRAWINGS

FIG. 8. illustrates in cross-sectional representation a chip scale package in accordance with the invention.

FIG. 9 illustrates in bottom planar view a land array for a multi-device package in accordance with the invention.

FIG. 10 illustrates in top planar view a chip attach site array for the multi-device package of FIG. 9.

FIG. 11 illustrates in top planar view the chip attach site array of FIG. 9 with multiple devices attached.

Like reference numbers and designations in the various drawings indicate like elements.

DETAILED DESCRIPTION

Figure 1:
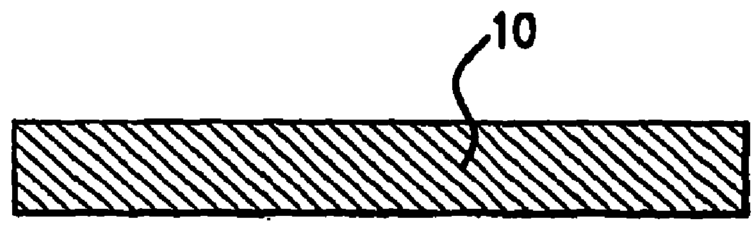
FIG. 1 illustrates in cross-sectional representation an electrically conductive substrate prior to patterning into a lead frame.

FIG. 1 illustrates in cross-sectional representation an electrically conductive substrate 10 that will be patterned into a lead frame used to route electrical signals in a semiconductor package for encasing at least one semiconductor device. The electrically conductive substrate 10 may be formed from any suitable electrically conductive material and is preferably formed from copper or a copper-base alloy. By copper-base alloy it is meant that the electrically conductive substrate 10 contains more than 50%, by weight, of copper. The electrically conductive substrate 10 has a preferred thickness of from 0.10 mm to 0.25 mm (0.004 inch to 0.010 inch) and is typically presented in the form of a coil of partially attached substrates that are singulated, typically as the final step in the manufacturing process.

Flip Chip Package with Chip Attach Pillars

Figure 2A:
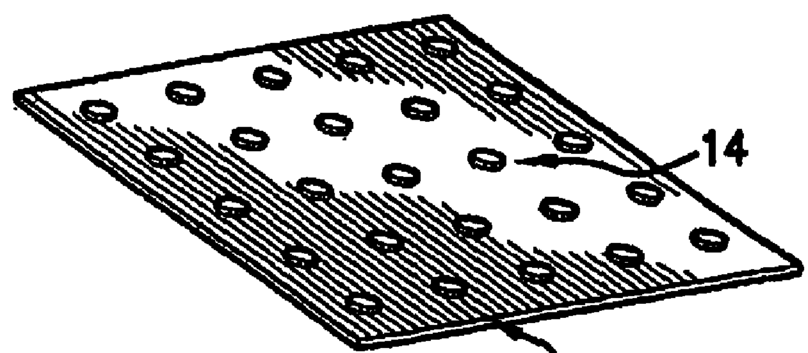
FIG. 2A illustrates in top planar view and FIG. 2B illustrates in cross-sectional representation a lead frame partially patterned on a first side.
Figure 2B:
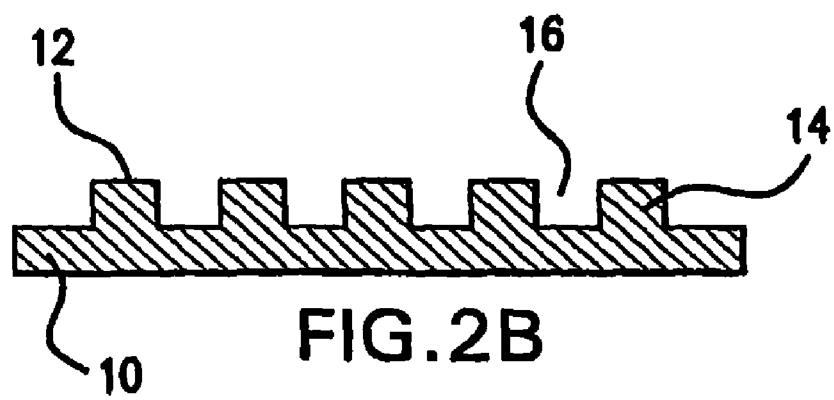

With reference to FIG. 2B, a first side 12 of the electrically conductive substrate 10 is partially patterned to form an array of lands 14 separated by channels 16. A surface of each of the lands 14 on the first side 12 comprises a portion of a planar first side surface of the lead frame.

The channels may be formed by any controlled subtractive process such as chemical etching or laser ablation. For example, the portions of the first surface intended to form the lands 14 may be coated with a chemical resist and the first surface exposed to a suitable etchant for a time effective to form channels 16. Typically, the channels 16 will have a depth of from 40% to 99% of the thickness of the electrically conductive substrate and preferably, the channel depth will be from 45% to 65% of the thickness of the electrically conductive substrate.

As shown in FIG. 2A, the lands 14 are formed in an array pattern adapted to be bonded to external circuitry, such as matching an array of bond pads on an external printed circuit board. To facilitate attachment by soldering to an external circuit board, lands 14 may be finished or plated with various solderable materials such as solder paste, Sn, Ag, Au, NiAu, etc.

A first molding compound is then disposed within the channels 16. As shown in FIG. 3B, the first polymer molding resin 18 preferably flush fills the channels 16 such that the first side of the lands 14 become lead-less lands adapted for bonding to external circuitry. In this embodiment, surfaces of the lands 14 and of the molding compound 18 are coplanar and comprise the planar first side surface of the lead frame. Alternatively, the first polymer molding resin may be added to a depth slightly less than the depth of the channels 16, so that the surface of the molding compound is recessed with respect to the first side surface and the lands are provided with a stand-off distance between the package and external printed circuit board. Preferably, the first molding resin 18 is electrically non-conductive and preferably a polymer molding resin, such as an epoxy, having a flow temperature in the range of 250° C. to 300° C. Alternatively, the first molding resin may be a low temperature thermal glass composite such as those used to attach a lead frame to a ceramic base in a CERPAK or CERDIP package.

Figure 3A:
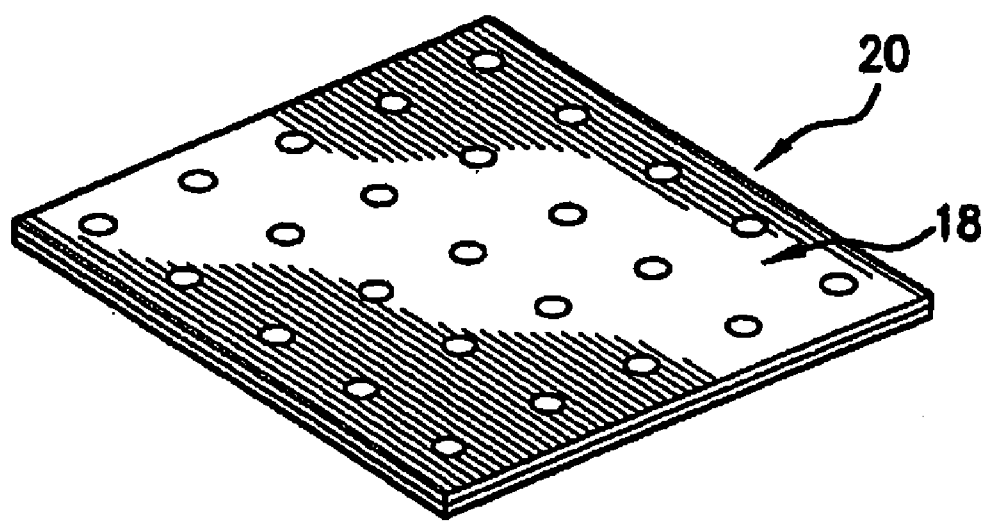
FIG. 3A illustrates in top planar view and FIG. 3B illustrates in cross-sectional representation the partially patterned lead frame with features embedded in a polymer molding resin.
Figure 3B:
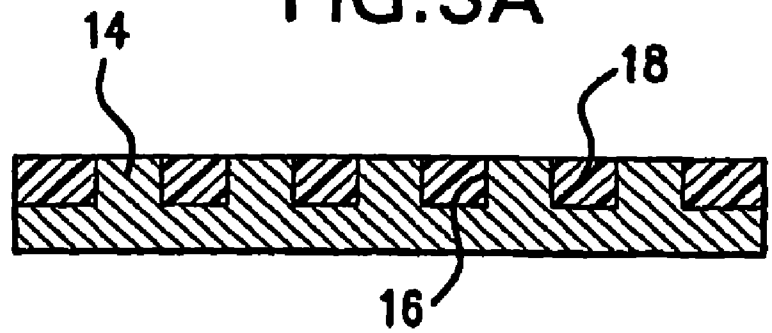

This assembly, a lead frame precursor 20 as illustrated in FIG. 3A, may be supplied by a lead frame supplier to a package assembly house for further processing, or the processing may continue with the lead frame manufacturer.

Figure 4:
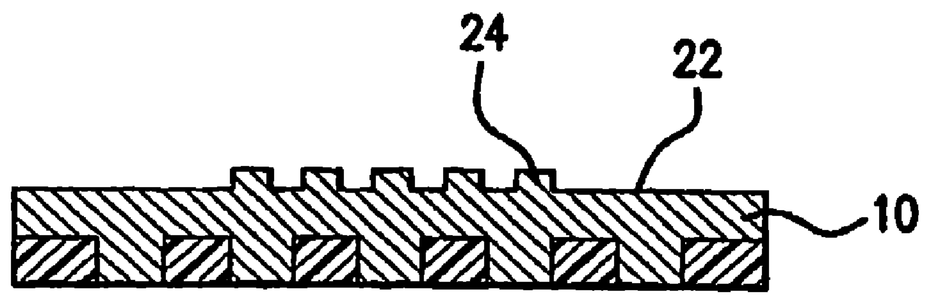
FIG. 4 illustrates in cross-sectional representation the formation of lead pillars in the second side of the partially patterned lead frame.

As shown in FIG. 4, an opposing second side 22 of the electrically conductive substrate 10 is then patterned to form chip attach sites 24 that are formed in an array effective for direct electrical interconnection to input/output pads on a semiconductor device. Any suitable method may be used to pattern the chip attach sites 24, such as a chemical etch or laser ablation. Preferably, a chemically resistant material is applied in the pattern of the array and the second side is then exposed to an etch solution for a time effective to remove sufficient material to define the chip attach sites 24.

Figure 5A:
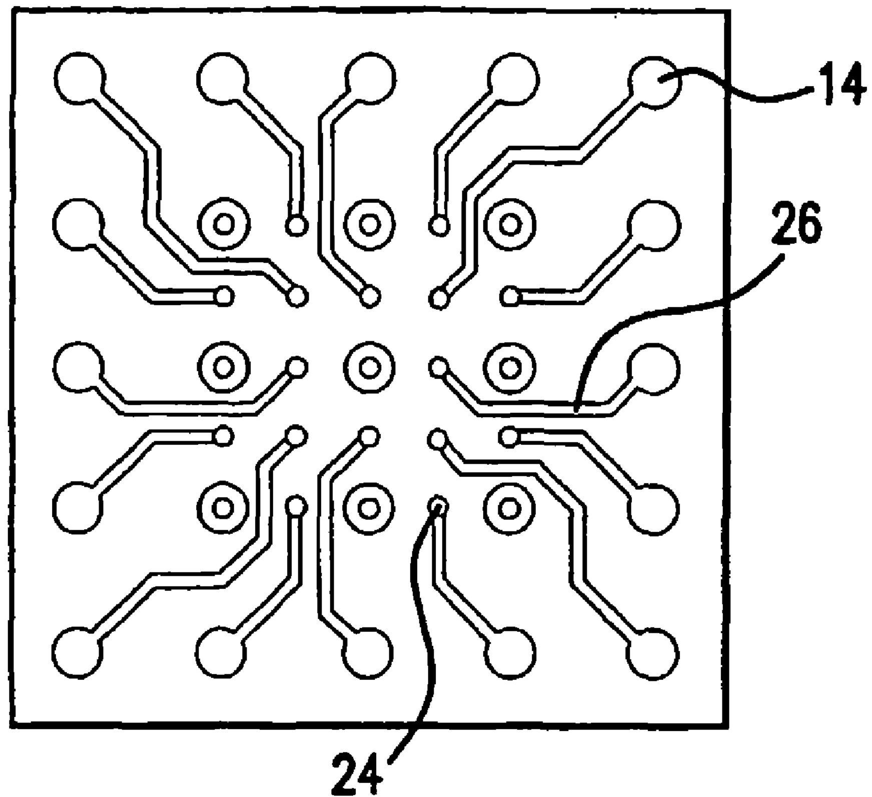
FIG. 5A illustrates in top planar view and FIG. 5B illustrates in cross-sectional representation the formation of routed lead frame features in the second side of the partially patterned lead frame.
Figure 5B:
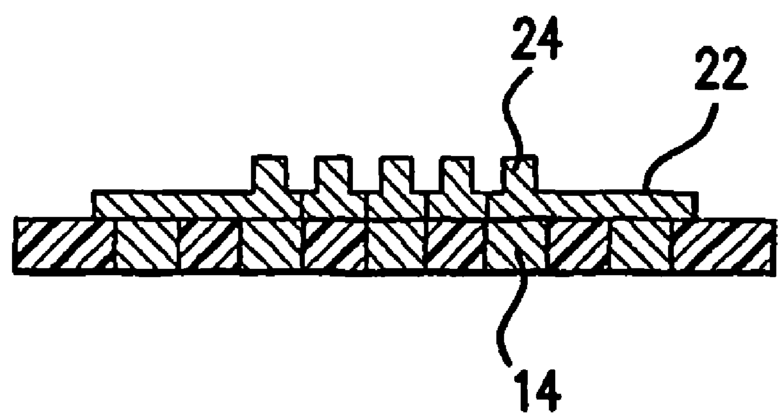

As illustrated in FIGS. 5A and 5B, the second side 22 is further patterned to form routing circuits 26 that electrically interconnect the chip attach sites 24 and the lands 14. Metal between routing circuits is removed to electrically isolate individual combinations of chip attach site—routing circuit—land. The routing circuits 26 each have a surface comprising a portion of a planar second side surface and electrically interconnect individual combinations of the array of lands 14 and the array of chip attach sites 24. In this embodiment, each of the chip attach sites 24 protrudes from the second side surface of the lead frame.

Figure 6A:
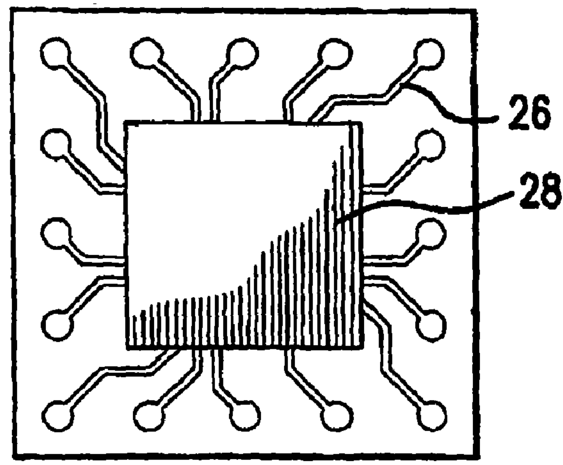
FIG. 6A illustrates in top planar view and FIG. 6B illustrates in cross-sectional representation the attachment of a semiconductor device to the lead pillars.
Figure 6B:
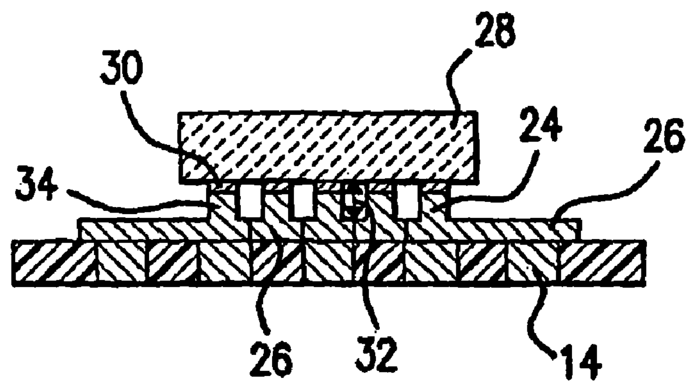

A semiconductor device 28 is directly attached and electrically interconnected to the lead frame at chip attach sites 24, as shown in FIGS. 6A and 6B. By "directly" it is meant that the interconnection is by a flip chip method without the use of an intervening wire bond or tape automated bonding (TAB) tape. Chip attach sites 24 are disposed opposite the input/output pads of device 28 and are interconnected by interconnections 30. Suitable interconnections 30 include solders with a primary constituent selected from the group consisting of gold, tin and lead with a melting temperature in the range of between 180° C. and 240° C. In this embodiment, chip attach pillars 34 extend upward from the routing circuits 26; the underside of device 28 is thus a distance 32 above the surface of routing circuits 26. The spacing 32 between the semiconductor device 28 and routing circuits 26 is chosen to facilitate the flow of a second molding compound, as detailed below. This spacing is generally at least 25 microns; in this embodiment, the spacing is at least 75 microns. In other embodiments, the spacing may be in the range of about 100 microns to about 150 microns. Preferably, 50% to 75% (in height) of the spacing 32 is due to the chip attach pillar 34 and 50%-25% (in height) of the spacing is due to interconnection 30.

Figure 7:
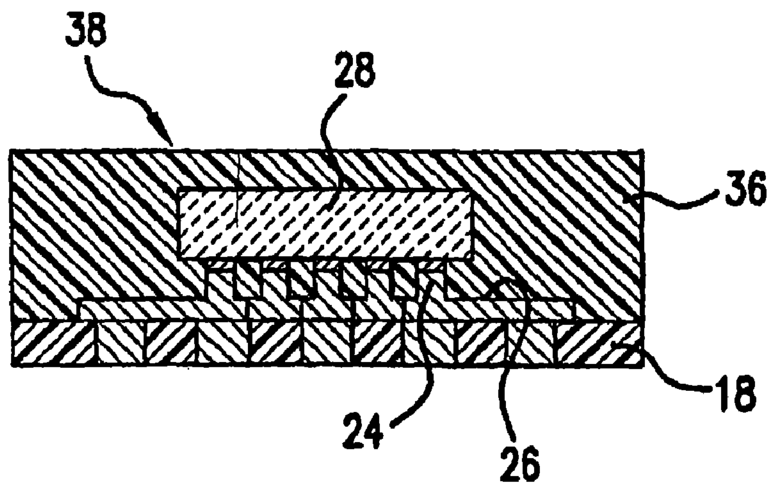
FIG. 7 illustrates in cross-sectional representation a lead frame routed semiconductor package in accordance with a first embodiment of the invention.

With reference to FIG. 7, the second molding compound 36 then encapsulates the semiconductor device 28, chip attach sites 24 and routing circuits 26 to complete the package 38 for encasing at least one semiconductor device. As with the first molding compound 18, the second molding compound 36 is electrically non-conductive and preferably a polymer molding resin, such as an epoxy, having a flow temperature in the range of 250° C. to 300° C. Alternatively, the second molding compound may also be a low temperature thermal glass composite such as those used to attach a lead frame to a ceramic base in a CERPAK or CERDIP package.

The combination of chip attach sites 24, chip attach pillars 34, routing circuits 26 and lands 14 is referred to as a "Re-Distributed Lead Frame" or RDLF. The RDLF is formed from a single electrically conductive substrate as a monolithic structure. In the package embodiment shown in FIG. 7, the array of lands 14 occupies a larger real estate than the array of chip attach sites 24. This type of package is a QFN (Quad-Flat-No lead) Flip-Chip package. Among the advantages of the package 38 of the invention over prior QFN Flip-Chip packages are:

a. the routing circuits are supported flat on the first molding compound, unlike the flatness problems associated with glued down or built-up circuit traces;
b. being supported, lead finger co-planarity issues disappear;
c. the flip-chip interconnection is highly robust and applicable for all packaging sizes and formats;
d. there are no exposed circuit traces or routing circuits under the package as in an etched leadless flip-chip package;
e. accommodates any chip-pad location and pitch;
f. approaches 100% yield and quality conformance;
g. eliminates need for interposer and adapts to existing chip designs;
h. the packaging area can be populated with mixed interconnections (wire bond, aluminum ultrasonic bond, flip-chip attach, etc.);
i. suitable for encapsulating multiple chips and surface mount passives;
j. no circuit traces or routing circuits are exposed at the bottom of the package, only leadless lands are present with or without desired stand-off;
k. the package may be very thin since a separate interposer is not required; and
l. the package may offer a thermal pad exposed on the bottom of package like a die-pad that can be connected to ground or thermal bumps on the chip.

Additional RDLF Package Configurations

FIG. 8 illustrates the RDLP (Re-Distributed Leadframe Package) of the invention in a chip scale package 40. In this embodiment, outermost rows of lands 14' are positioned under the foot print of the semiconductor device 28 and subsequent rows of lands 14" are positioned within the perimeter defined by the outermost rows of lands 14'. The CSP 40 occupies substantially the same amount of real estate as the semiconductor device 28.

FIGS. 9 through 11 illustrate embodiments of the invention within a multi-device package. Although any of the RDLP configurations illustrated may be equally used in a single device package.

FIG. 9 illustrates in bottom planar view a land array for a multi-device package in accordance with the disclosure. In addition to lands 14 for electrical interconnection to external circuitry, the first side of the electrically conductive substrate may be patterned into a heat sink 42 for thermal interconnection to an external thermal dissipater.

FIG. 10 illustrates in top planar view an array of chip attach sites 24 interconnected to the lands 14 of FIG. 9 by routing circuits 26. Other features patterned in the second side include a die pad 44 thermally interconnected to the heat sink 42 and bond sites 46 for passive devices such as resistors or capacitors. Portions of the bond sites 46 may be coated with a solderable metal, such as gold, to facilitate attachment of the passive devices.

FIG. 11 illustrates some of the flexibility achieved with the RDLP of the invention. A first semiconductor device 28 is flip chip bonded to the chip attach sites. A second semiconductor device 28' is attached to the die pad 44 and wire bonded 48 to wire bond pads 50. Passive devices 52 are soldered to bond sites 46 and electrically interconnected 54 to the second semiconductor die 28'. The features and devices illustrated in FIG. 11 are then encapsulated in the second molding resin (not shown) to complete the multi-device package.

Flip Chip Package with Chip Attach Sites Coplanar with Routing Circuits

FIGS. 12-15 illustrate formation of a semiconductor package according to another embodiment of the disclosure. As in the first embodiment, an electrically conductive substrate 10 is patterned into a lead frame used to route electrical signals in a semiconductor package for encasing at least one semiconductor device. The electrically conductive substrate 10 (formed from any suitable electrically conductive material, preferably copper or a copper-base alloy) has a first side which is partially patterned to form an array of lands 14 separated by channels. A surface of each of the lands 14 on the first side comprises a portion of the first side surface 121 of the lead frame. The channels may be formed by any controlled subtractive process such as chemical etching or laser ablation. For example, the portions of the first surface intended to form the lands 14 may be coated with a chemical resist and the first surface exposed to a suitable etchant for a time effective to form the channels. Typically, the channels will have a depth of from 40% to 99% of the thickness of the electrically conductive substrate and preferably, the channel depth will be from 45% to 65% of the thickness of the electrically conductive substrate. The lands 14 are formed in an array pattern adapted to be bonded to external circuitry, such as matching an array of bond pads on an external printed circuit board. As noted above, to facilitate attachment by soldering to an external circuit board, lands 14 may be finished or plated with various solderable materials such as solder paste, Sn, Ag, Au, NiAu, etc.

Figure 12:
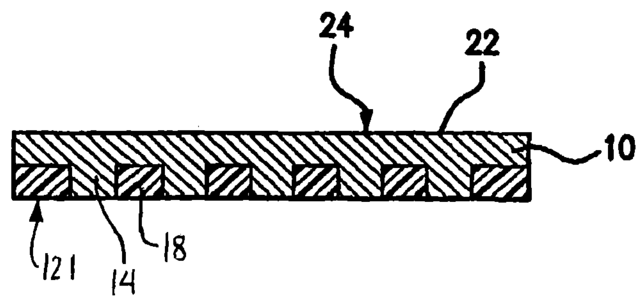
FIG. 12 illustrates in cross-sectional representation a lead frame including an electrically conductive substrate as shown in FIG. 2B, with lands and chip attach sites on opposing first and second sides of the lead frame, in accordance with another embodiment.

As shown in FIG. 12, a first molding compound 18 is then disposed within the channels separating the lands 14. The first molding compound, typically a polymer molding resin, preferably flush fills the channels such that the lands 14 on the first side 12 become lead-less lands adapted for bonding to external circuitry. In this embodiment, surfaces of the lands 14 and of the molding compound 18 are coplanar and comprise the planar first side surface 121 of the lead frame. Alternatively, polymer molding resin may be added to a depth slightly less than the depth of the channels, so that the surface of the molding compound is recessed with respect to the first side surface and the lands are provided with a stand-off distance between the package and an external printed circuit board.

Preferably, the first molding compound 18 is electrically non-conductive and preferably a polymer molding resin, such as an epoxy, having a flow temperature in the range of 250° C. to 300° C. Alternatively, the first molding compound may be a low temperature thermal glass composite such as those used to attach a lead frame to a ceramic base in a CERPAK or CERDIP package.

This assembly may be supplied by a lead frame supplier to a package assembly house for further processing, or the processing may continue with the lead frame manufacturer.

Figure 13A:
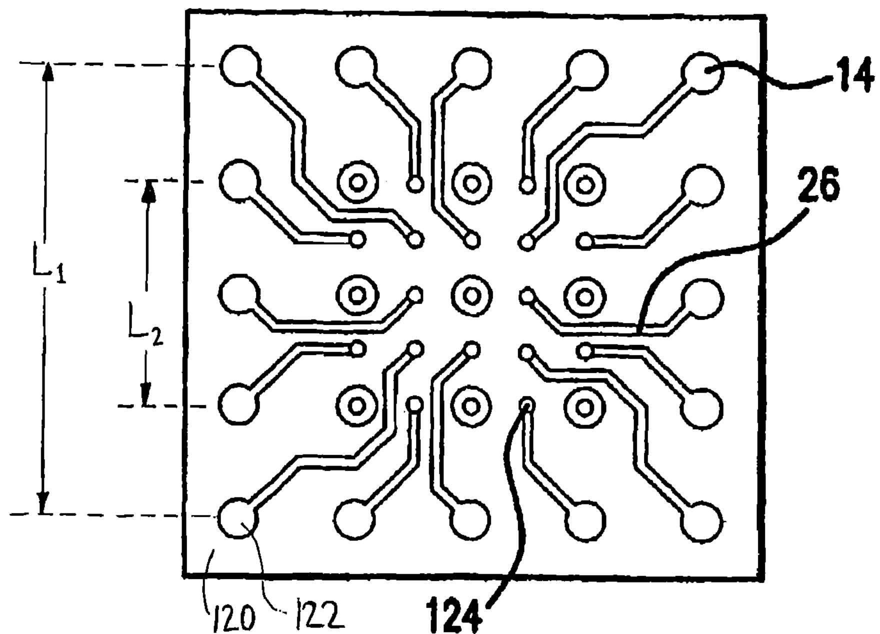
FIG. 13A illustrates in top planar view and FIG. 13B illustrates in cross-sectional representation the formation of routed lead frame features, including routing circuits and chip attach sites, on the second side of the partially patterned lead frame of FIG. 12 in accordance with an embodiment of the disclosure.
Figure 13B:
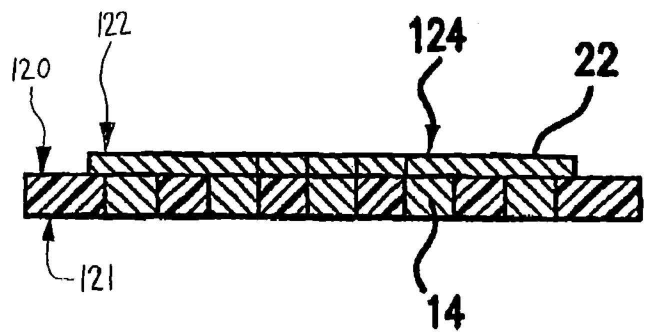

As shown in FIG. 12, electrically conductive substrate 10 has a second side 22 opposing first side 12. Side 22 is patterned to form routing circuits 26, as shown in FIGS. 13A and 13B. Any suitable method may be used to pattern the electrically conductive material, such as a chemical etch or laser ablation. Preferably, a chemically resistant material is applied in the pattern of the circuits, and the second side 22 is then exposed to an etch solution for a time effective to remove sufficient electrically conductive material to define the routing circuits 26. As shown in FIGS. 13A and 13B, sufficient material is removed in regions between the routing circuits 26 to expose a surface 120 of the molding compound 18, while the routing circuits are coplanar with a surface 122 of electrically conductive material. As best shown in FIG. 13B, the lead frame in this embodiment thus has planar first and second side surfaces 121, 122 respectively.

In FIG. 13B and other cross-sectional views, electrically conductive areas on the second side of the lead frame may appear to be in contact with each other. Comparison with the corresponding plan views (e.g. FIG. 13A), however, makes it clear that this is merely an effect of viewing those areas on edge; areas that appear to be in contact are actually separated and at different distances from the viewer.

As best shown in FIG. 13A, an array of chip attach sites 124 are formed on the second side of the lead frame. The routing circuits 26 electrically interconnect the chip attach sites 124 and the lands 14. Metal between routing circuits is removed to electrically isolate individual combinations of chip attach site—routing circuit—land. In this embodiment, the chip attach sites 124 are coplanar with the routing circuits 26; chip attach pillars are not formed (compare FIGS. 5B and 6B with FIGS. 13B and 14B). The chip attach sites 124 are formed in an array effective for direct electrical interconnection to input/output pads on a semiconductor device.

Figure 14A:
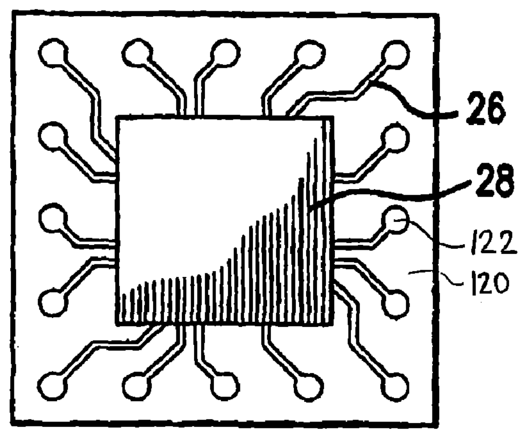
FIG. 14A illustrates in top planar view and FIG. 14B illustrates in cross-sectional representation the attachment of a semiconductor device to the chip attach sites of the lead frame of FIGS. 13A and 13B.
Figure 14B:
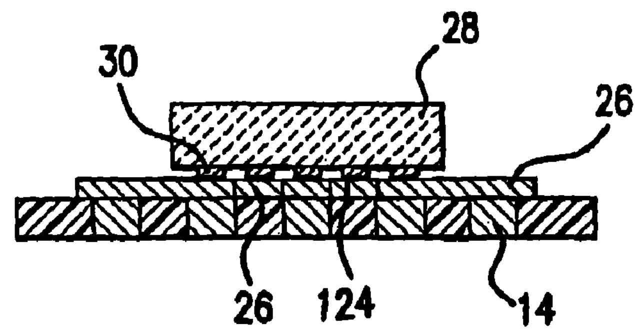

A semiconductor device 28 is directly attached and electrically interconnected to the chip attach sites 124, as shown in FIGS. 14A and 14B. By "directly" it is meant that the interconnection is by a flip chip method without the use of an intervening wire bond or tape automated bonding (TAB) tape. Chip attach sites 124 are disposed opposite the input/output pads of device 28 and are interconnected by interconnections 30. Suitable interconnections 30 include solders with a primary constituent selected from the group consisting of gold, tin and lead with a melting temperature in the range of between 180° C. and 240° C. The spacing between the semiconductor device 28 and routing circuits 26 is sufficient to permit flow of a second molding compound 36 both above and beneath device 28. In this embodiment, the spacing is at least 25 microns.

Figure 15:
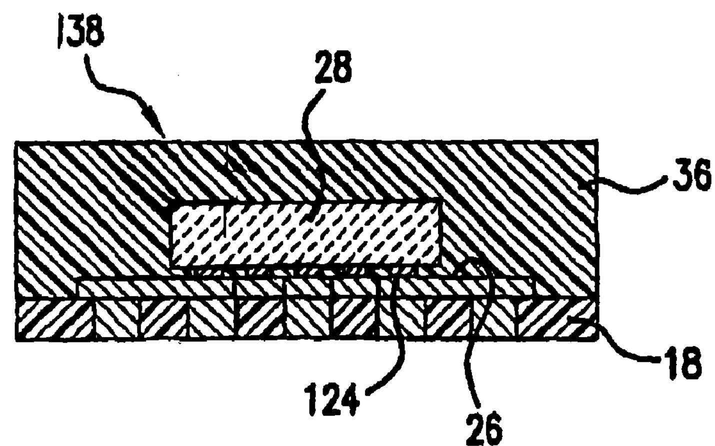
FIG. 15 illustrates in cross-sectional representation a lead frame routed semiconductor package in accordance with an embodiment, where a molding compound encapsulates the semiconductor device, chip attach sites and routing circuits of FIGS. 14A and 14B.

With reference to FIG. 15, the second molding compound 36 then encapsulates the semiconductor device 28, chip attach sites 124 and routing circuits 26 to complete package 138 for encasing at least one semiconductor device. As with the first molding compound 18, the second molding compound 36 is electrically non-conductive and preferably a polymer molding resin, such as an epoxy, having a flow temperature in the range of 250° C. to 300° C. Alternatively, the second molding compound may also be a low temperature thermal glass composite such as those used to attach a lead frame to a ceramic base in a CERPAK or CERDIP package.

The distance between the semiconductor device 28 and the routing circuits 26 is at least about 25 microns; the space defined by that distance is filled with second molding compound 36.

The combination of chip attach sites 124, routing circuits 26 and lands 14, in accordance with this embodiment, is referred to as a "Re-Distributed Lead Frame" or RDLF. The RDLF is formed from a single electrically conductive substrate as a monolithic structure. In the package 138 of this embodiment, the array of lands 14 has a lateral extent $L_1$ greater than the lateral extent $L_2$ of the array of chip attach sites 124 (see FIG. 13A). This type of package is a QFN (Quad-Flat-No lead) Flip-Chip package.

QFN package 138 has the same advantages as discussed above with reference to package 38, and in addition has the advantages of further reduced height and fewer processing steps.

It will be appreciated that the RDLF of package 138 may also be used in a Re-Distributed Leadframe Package (RDLP), similarly to the package 38 discussed above and shown in FIGS. 8-11. For example, an RDLP with package 138 may be used in a chip scale package (see FIG. 8) in which the lateral extent of the device 28, the array of chip sites 124, and the array of lands 14 are all substantially equal.

Wirebonded Chip Package with Die Pad

FIGS. 16A-18 illustrate formation of a semiconductor package according to another embodiment of the disclosure. As in the embodiments described above, an electrically conductive substrate 10 is patterned into a lead frame used to route electrical signals in a semiconductor package for encasing at least one semiconductor device. The electrically conductive substrate 10 (formed from any suitable electrically conductive material, preferably copper or a copper-base alloy) has a first side which is partially patterned to form an array of lands 14 separated by channels. A surface of each of the lands 14 on the first side comprises a portion of the first side surface 121 of the lead frame (see FIG. 12). The channels may be formed by any controlled subtractive process such as chemical etching or laser ablation. For example, the portions of the first surface intended to form the lands 14 may be coated with a chemical resist and the first surface exposed to a suitable etchant for a time effective to form the channels. Typically, the channels will have a depth of from 40% to 99% of the thickness of the electrically conductive substrate and preferably, the channel depth will be from 45% to 65% of the thickness of the electrically conductive substrate. The lands 14 are formed in an array pattern adapted to be bonded to external circuitry, such as matching an array of bond pads on an external printed circuit board. As noted above, to facilitate attachment by soldering to an external circuit board, lands 14 may be finished or plated with various solderable materials such as solder paste, Sn, Ag, Au, NiAu, etc.

A first molding compound 18 is then disposed within the channels separating the lands 14. The first molding compound, typically a polymer molding resin, preferably flush fills the channels such that the lands 14 on the first side become lead-less lands adapted for bonding to external circuitry. In this embodiment, surfaces of the lands 14 and of the molding compound 18 are coplanar and comprise the planar first side surface 221 of the lead frame. Alternatively, polymer molding resin may be added to a depth slightly less than the depth of the channels, so that the surface of the molding compound is recessed with respect to the first side surface and the lands are provided with a stand-off distance between the package and an external printed circuit board.

Preferably, the first molding compound 18 is electrically non-conductive and preferably a polymer molding resin, such as an epoxy, having a flow temperature in the range of 250° C. to 300° C. Alternatively, the first molding compound may be a low temperature thermal glass composite such as those used to attach a lead frame to a ceramic base in a CERPAK or CERDIP package.

This assembly may be supplied by a lead frame supplier to a package assembly house for further processing, or the processing may continue with the lead frame manufacturer.

Figure 16A:
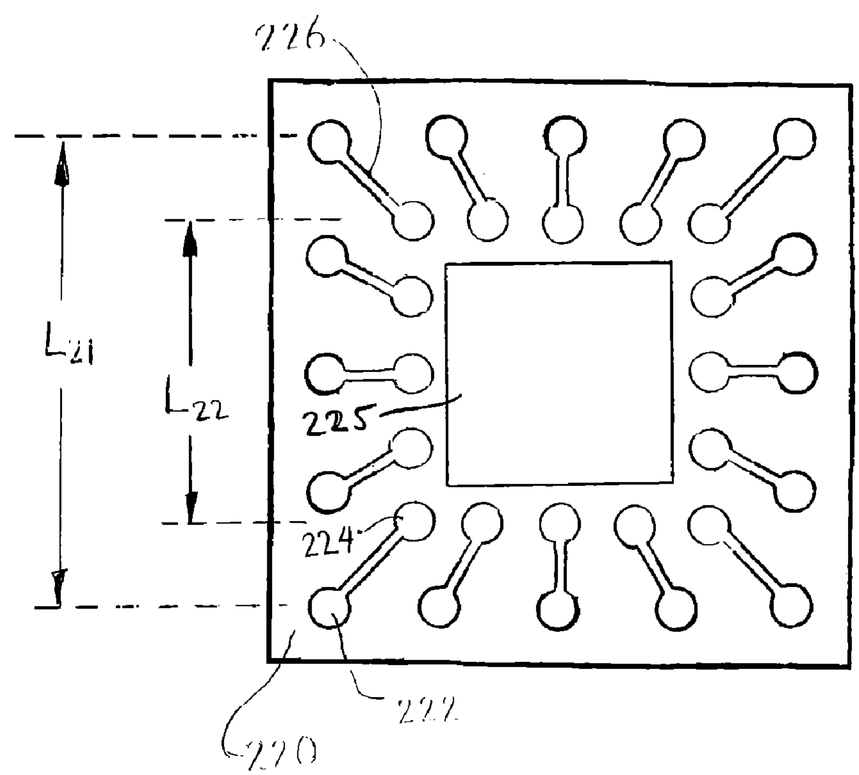
FIG. 16A illustrates in top planar view and FIG. 16B illustrates in cross-sectional representation the formation of routed lead frame features, including routing circuits and a die pad, on the second side of a partially patterned lead frame in accordance with another embodiment of the disclosure.
Figure 16B:
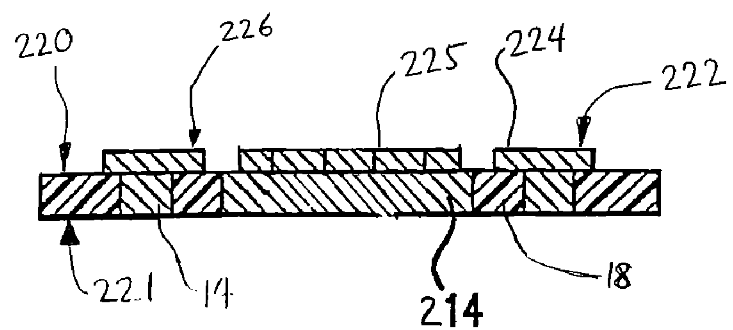

As in the embodiments described above, electrically conductive substrate 10 has a second side opposing the first side. The second side is patterned to form a die pad 225 and routing circuits 226, as shown in FIGS. 16A and 16B. Any suitable method may be used to pattern the electrically conductive material, such as a chemical etch or laser ablation. Preferably, a chemically resistant material is applied in the pattern of the circuits, and the second side is then exposed to an etch solution for a time effective to remove sufficient electrically conductive material to define the die pad 225 and routing circuits 226. As shown in FIGS. 16A and 16B, sufficient material is removed in regions between the die pad and routing circuits and between routing circuits to expose a surface 220 of the molding compound 18, while the die pad and routing circuits are coplanar with a surface 222 of electrically conductive material. As best shown in FIG. 16B, the lead frame in this embodiment thus has planar first and second side surfaces 221, 222 respectively.

As best shown in FIG. 16A, an array of wirebonding sites 224 are formed on the second side of the lead frame, spaced apart from and surrounding the die pad 225. The routing circuits 226 electrically interconnect the wirebonding sites 224 and the lands 14. Metal between routing circuits is removed to electrically isolate individual combinations of wirebonding site—routing circuit—land. In this embodiment, the wirebonding sites 224 are coplanar with the routing circuits 226. The wirebonding sites 224 are arranged for electrical connection to input/output pads on a semiconductor device. In particular, wirebonding sites 224 may advantageously be finished or plated with material to facilitate wirebonding, e.g. Ag, NiPdAu, NiAu, etc.

Figure 16C:
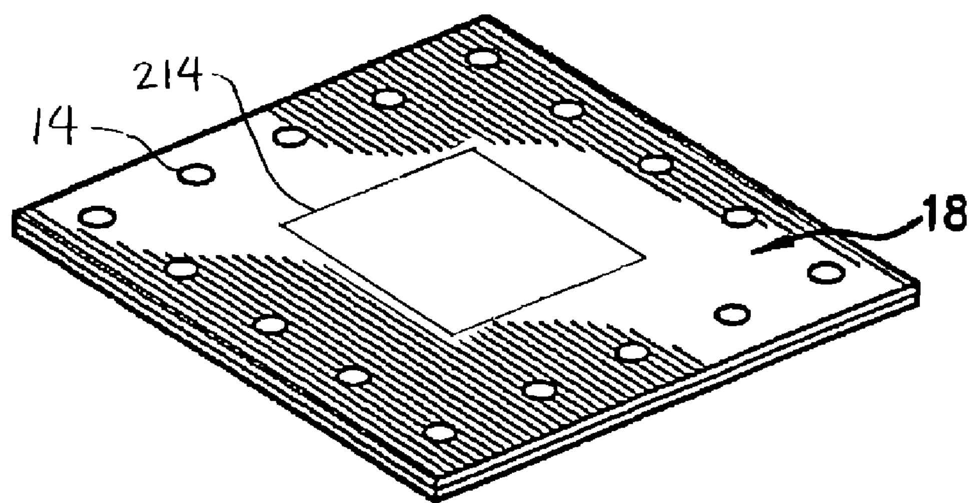
FIG. 16C illustrates in bottom perspective view the lead frame of FIGS. 16A and 16B.

In this embodiment, the die pad occupies a central portion of the second side surface, and both the lands and the wirebonding sites are arranged about the periphery of the die pad. The die pad is disposed on a central portion of the substrate without lands. FIG. 16C is a bottom view of the leadframe in this embodiment; the portion of the substrate corresponding to the location of the die pad has an exposed bottom surface 214 and is surrounded by lands 14 (compare FIG. 3A).

Figure 17A:
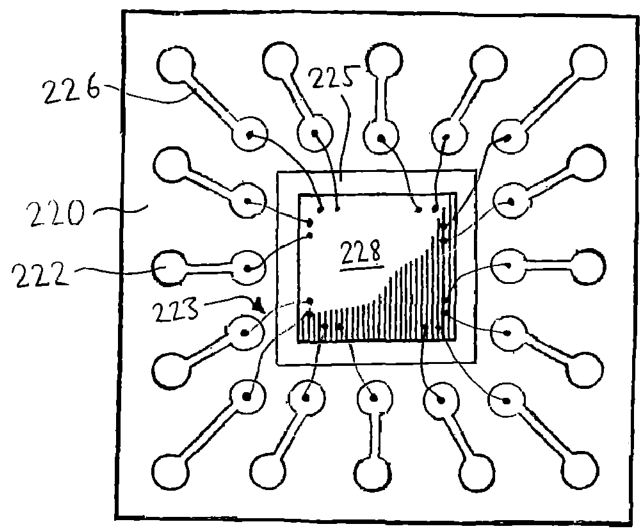
FIG. 17A illustrates in top planar view and FIG. 17B illustrates in cross-sectional representation the attachment of a semiconductor device to the die pad and lead frame of FIGS. 16A and 16B.
Figure 17B:
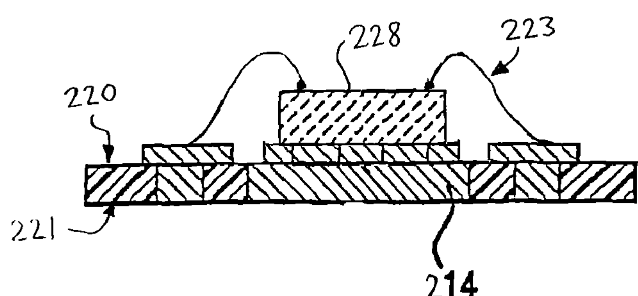

A semiconductor device 228 is directly attached to die pad 225 and electrically connected to the wirebonding sites 224 by wires 223, as shown in FIGS. 17A and 17B. The routing circuits 226 may follow a variety of different paths; this permits the wirebonding sites 224 to be arranged so as to improve the wiring layout.

Figure 18:
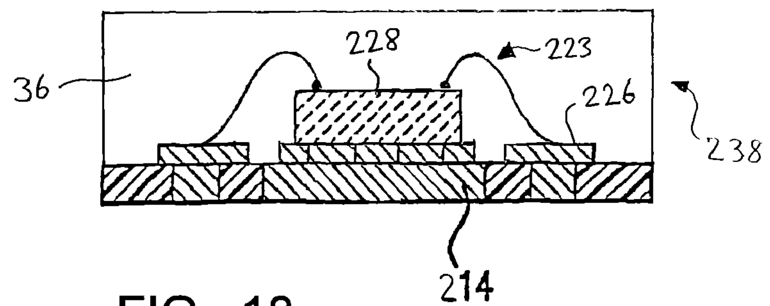
FIG. 18 illustrates in cross-sectional representation a lead frame routed semiconductor package in accordance with an embodiment, where a molding compound encapsulates the semiconductor device, die pad and routing circuits of FIGS. 17A and 17B.

With reference to FIG. 18, the second molding compound 36 then encapsulates the semiconductor device 228, wirebonding sites 224 and routing circuits 226 to complete package 238 for encasing at least one semiconductor device. As with the first molding compound 18, the second molding compound 36 is electrically non-conductive and preferably a polymer molding resin, such as an epoxy, having a flow temperature in the range of 250° C. to 300° C. Alternatively, the second molding compound may also be a low temperature thermal glass composite such as those used to attach a lead frame to a ceramic base in a CERPAK or CERDIP package.

The leadframe in this embodiment is a Re-Distributed Leadframe (RDLF) formed from a single electrically conductive substrate as a monolithic structure. In the package 238 of this embodiment, the array of lands 14 has a lateral extent $L_{21}$ greater than the lateral extent $L_{22}$ of the array of wirebonding sites 224 (see FIG. 16A). This type of package is a QFN (Quad-Flat-No lead) package.

The RDLF of package 238 may also be used in a Re-Distributed Leadframe Package (RDLP), similarly to the packages discussed above and shown in FIGS. 9-11.

Wirebonded Chip Package with Additional Wirebonding Sites

FIGS. 19A-21 illustrate formation of a semiconductor package according to still another embodiment of the disclosure. As in the embodiments described above, an electrically conductive substrate 10 is patterned into a lead frame used to route electrical signals in a semiconductor package for encasing at least one semiconductor device. The electrically conductive substrate 10 (formed from any suitable electrically conductive material, preferably copper or a copper-base alloy) has a first side which is partially patterned to form an array of lands 14 separated by channels. A surface of each of the lands 14 on the first side comprises a portion of the first side surface 121 of the lead frame (see FIG. 12). The channels may be formed by any controlled subtractive process such as chemical etching or laser ablation. For example, the portions of the first surface intended to form the lands 14 may be coated with a chemical resist and the first surface exposed to a suitable etchant for a time effective to form the channels. Typically, the channels will have a depth of from 40% to 99% of the thickness of the electrically conductive substrate and preferably, the channel depth will be from 45% to 65% of the thickness of the electrically conductive substrate. The lands 14 are formed in an array pattern adapted to be bonded to external circuitry, such as matching an array of bond pads on an external printed circuit board. As noted above, to facilitate attachment by soldering to an external circuit board, lands 14 may be finished or plated with various solderable materials such as solder paste, Sn, Ag, Au, NiAu, etc.

A first molding compound 18 is then disposed within the channels separating the lands 14. The first molding compound, typically a polymer molding resin, preferably flush fills the channels such that the lands 14 on the first side become lead-less lands adapted for bonding to external circuitry. In this embodiment, surfaces of the lands 14 and of the molding compound 18 are coplanar and comprise the planar first side surface 221 of the lead frame. Alternatively, polymer molding resin may be added to a depth slightly less than the depth of the channels, so that the surface of the molding compound is recessed with respect to the first side surface and the lands are provided with a stand-off distance between the package and an external printed circuit board.

Preferably, the first molding compound 18 is electrically non-conductive and preferably a polymer molding resin, such as an epoxy, having a flow temperature in the range of 250° C. to 300° C. Alternatively, the first molding compound may be a low temperature thermal glass composite such as those used to attach a lead frame to a ceramic base in a CERPAK or CERDIP package.

This assembly may be supplied by a lead frame supplier to a package assembly house for further processing, or the processing may continue with the lead frame manufacturer.

Figure 19A:
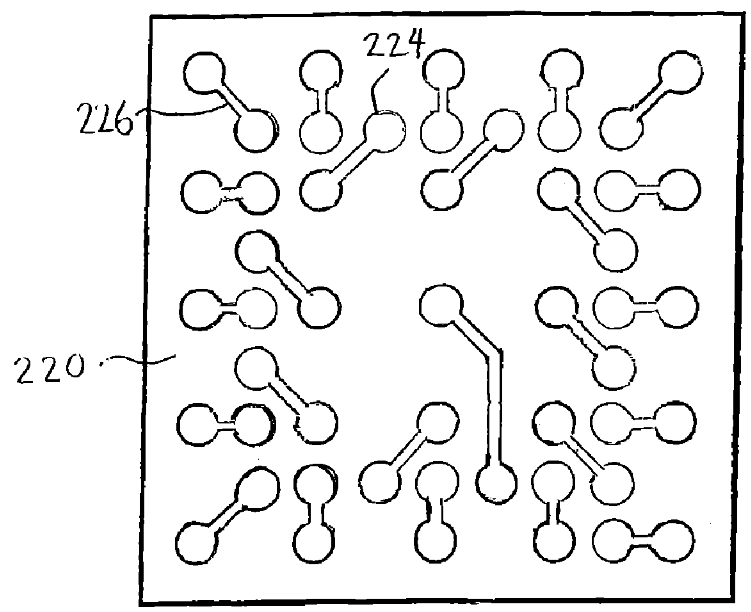
FIG. 19A illustrates in top planar view and FIG. 19B illustrates in cross-sectional representation the formation of routed lead frame features, including routing circuits, on the second side of a partially patterned lead frame in accordance with a further embodiment of the disclosure.
Figure 19B:
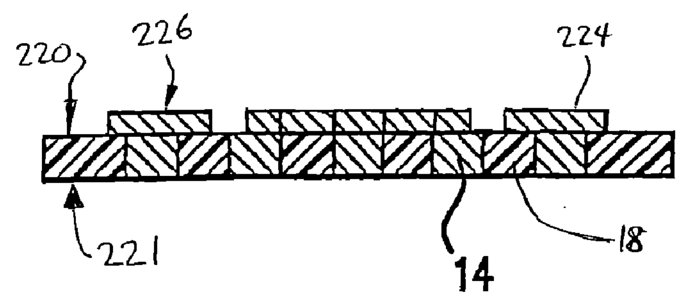

As in the embodiments described above, electrically conductive substrate 10 has a second side opposing the first side. The second side is patterned to form routing circuits 226 including wirebonding sites 224, as shown in FIGS. 19A and 19B. Any suitable method may be used to pattern the electrically conductive material, such as a chemical etch or laser ablation. Preferably, a chemically resistant material is applied in the pattern of the circuits, and the second side is then exposed to an etch solution for a time effective to remove sufficient electrically conductive material to define the outing circuits 226. As shown in FIGS. 19A and 19B, sufficient material is removed in regions between the die pad and routing circuits and between routing circuits to expose a surface 220 of the molding compound 18, while the die pad and routing circuits are coplanar with a surface of electrically conductive material as in the previously described embodiment. As best shown in FIG. 19B, the lead frame in this embodiment thus has planar first and second side surfaces.

As best shown in FIG. 19A, an array of wirebonding sites 224 are formed on the second side of the lead frame. The routing circuits 226 electrically interconnect the wirebonding sites 224 and the lands 14. Metal between routing circuits is removed to electrically isolate individual combinations of wirebonding site—routing circuit—land. In this embodiment, the wirebonding sites 224 are coplanar with the routing circuits 226. The wirebonding sites 224 are arranged for electrical connection to input/output pads on a semiconductor device. In particular, wirebonding sites 224 may advantageously be finished or plated with material to facilitate wirebonding, e.g. Ag, NiPdAu, NiAu, etc.

Figure 19C:
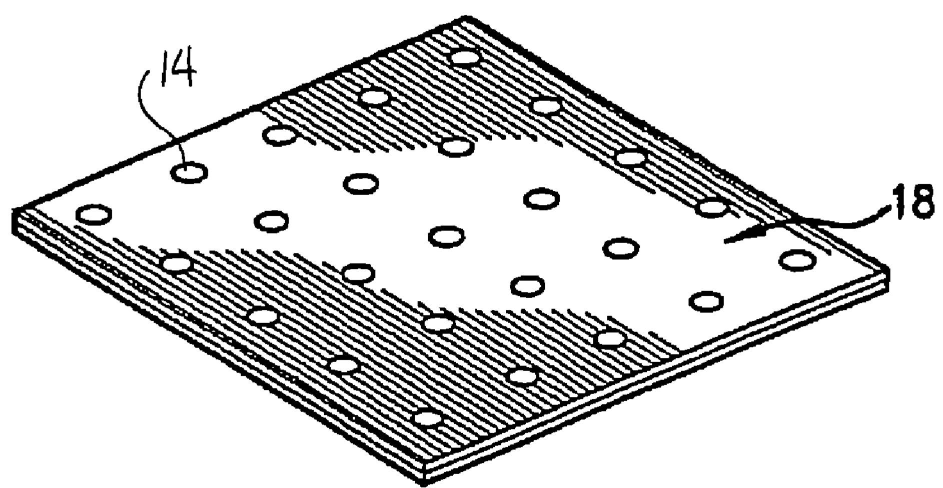
FIG. 19C illustrates in bottom perspective view the lead frame of FIGS. 19A and 19B.
Figure 20A:
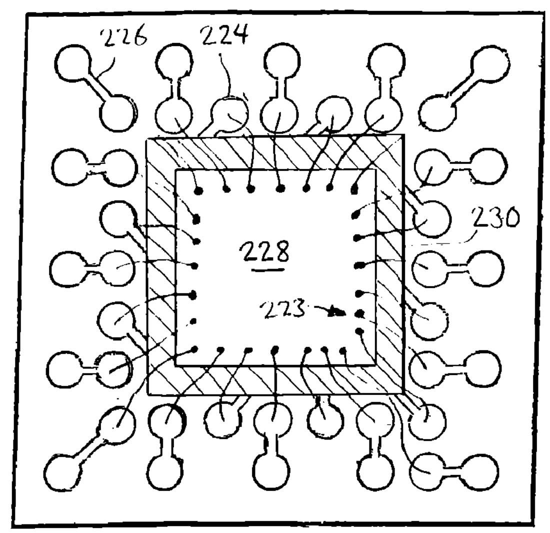
FIG. 20A illustrates in top planar view and FIG. 20B illustrates in cross-sectional representation the attachment of a semiconductor device to the lead frame of FIGS. 19A and 19B.

In this embodiment, the second side surface is populated with wirebonding sites 224 making electrical connections to lands 14, where the lands are arranged in a regular array on the first side surface (see FIG. 19C). Accordingly, some of the routing circuits have exposed metal surfaces in the central portion of the second side surface. An electrically non-conductive layer 230 covers these metal surfaces, as shown in FIG. 20A. Layer 230 may be a non-conductive epoxy or a non-conductive paste. The wirebonding sites 224 are arranged about the periphery of the area covered by layer 230.

Figure 20B:
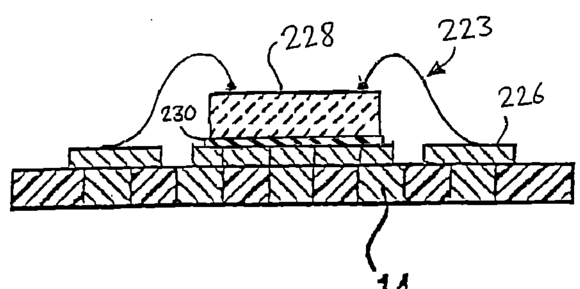

Semiconductor device 228 is disposed on layer 230 and electrically connected to the wirebonding sites 224 by wires 223, as shown in FIGS. 20A and 20B. The non-conductive material for layer 230 may be dispensed on the second side surface, or alternatively may be applied to the back side of the device before the device is attached.

At least one of the routing circuits leads underneath device 228 and layer 230 to connect with a land in the central portion of the leadframe (compare FIGS. 19A and 20A). Accordingly, such a routing circuit connects to an electrical conductor (an "active post") extending from the first side to the second side of the leadframe, underneath the device. This arrangement provides a greater number of wirebonding sites than in the previous embodiment (compare FIGS. 17A and 20A). Accordingly, the leadframe of this embodiment offers greater I/O capability.

Figure 21:
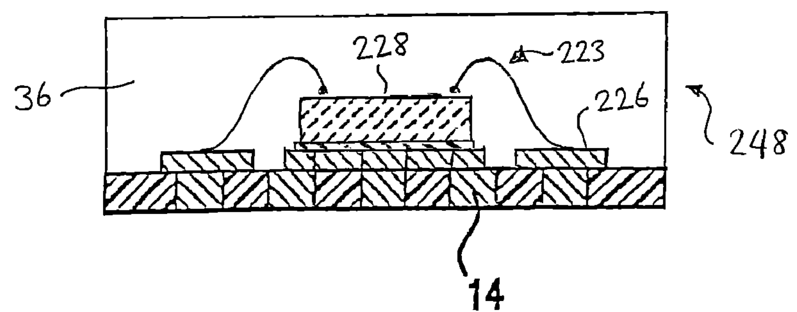
FIG. 21 illustrates in cross-sectional representation a lead frame routed semiconductor package in accordance with an embodiment, where a molding compound encapsulates the semiconductor device and routing circuits of FIGS. 20A and 20B.

With reference to FIG. 21, the second molding compound 36 then encapsulates the semiconductor device 228, wirebonding sites 224 and routing circuits 226 to complete package 248 for encasing at least one semiconductor device. As with the first molding compound 18, the second molding compound 36 is electrically non-conductive and preferably a polymer molding resin, such as an epoxy, having a flow temperature in the range of 250° C. to 300° C. Alternatively, the second molding compound may also be a low temperature thermal glass composite such as those used to attach a lead frame to a ceramic base in a CERPAK or CERDIP package.

As in other embodiments, the leadframe in this embodiment is a Re-Distributed Leadframe (RDLF) formed from a single electrically conductive substrate as a monolithic structure. In the package 248 of this embodiment, the array of lands 14 has a lateral extent greater than or equal to the lateral extent of the array of wirebonding sites 224. This type of package is a QFN (Quad-Flat-No lead) package.

The RDLF of package 248 may also be used in a Re-Distributed Leadframe Package (RDLP), similarly to the packages discussed above and shown in FIGS. 9-11.

Several embodiments of the present disclosure have been described. Nevertheless, it will be understood that various modifications may be made without departing from the spirit and scope of the disclosure. Accordingly, other embodiments are within the scope of the following claims.

What is claimed is:

1. A package (138) for encasing at least one semiconductor device (28), comprising:

a lead frame including an electrically conductive substrate and having opposing first and second sides, said first side of said lead frame having a planar first side surface (121) and an array of lands (14), a surface of each of said lands comprising a portion of said first side surface, said lands adapted to be bonded to external circuitry and being arranged in a first pattern, and said second side of said lead frame having a planar second side surface (122) and an array of chip attach sites (124), each of said chip attach sites comprising a portion of said second side surface, said chip attach sites being arranged in a second pattern and being directly electrically interconnected by interconnections (30) to input/output pads on said at least one semiconductor device (28), said chip attach sites disposed opposite said input/output pads, and a plurality of electrically isolated routing circuits (26) each having a surface comprising a portion of said second side surface and coplanar with the chip attach sites (124), electrically interconnecting individual combinations of said array of lands (14) and said array of chip attach sites (124);

a first molding compound (18), disposed at said first side of said lead frame and between individual lands of said array of lands (14), having a surface comprising a portion of said first side surface (121); and a second molding compound (36) encapsulating said at least one semiconductor device (28), said array of chip attach sites (124) and said routing circuits (26), wherein the lands and chip attach sites are formed from a monolithic electrically conductive structure, the array of lands (14) has a lateral extent greater than or equal to that of the array of chip attach sites (124), and the second molding compound does not extend to the first side of the lead frame.

2. The package (138) of claim 1 wherein said lead frame and said routing circuits (26) are elements of a single electrically conductive substrate (10).

3. The package (138) of claim 2 wherein said single electrically conductive substrate (10) is copper or a copper-base alloy.

4. The package (138) of claim 2 wherein a first perimeter defined by said array of lands (14) does not exceed a second perimeter defined by said at least one semiconductor device (28).

5. The package (138) of claim 4 being a chip scale package.

6. The package (138) of claim 2 further including a heat sink (42) that is a single electrically conductive substrate with said lead frame and coplanar with said array of lands (14).

7. The package (138) of claim 2 further including a die pad (44) for bonding one of said at least one semiconductor devices (28), said die pad (44) being monolithic with said lead frame.

8. The package (138) of claim 2 further including bond sites for bonding a passive device (52), said bond sites being monolithic with said lead frame.

9. The package (138) of claim 2 wherein a distance (32) between said at least one semiconductor device (28) and said routing circuits (26) is at least 25 microns and a space defined by said distance (32) is filled with said second molding compound (36).

10. The package (138) of claim 1 wherein at least one land in said array of lands (14) includes at least one of solder paste, Sn, Ag, Au, and NiAu.

11. A package (138) for encasing at least one semiconductor device (28), comprising:

a lead frame including an electrically conductive substrate and having opposing first and second sides, said first side of said lead frame having a planar first side surface (121) and an array of lands (14), a surface of each of said lands comprising a portion of said first side surface, said lands adapted to be bonded to external circuitry and being arranged in a first pattern, and said second side of said lead frame having a planar second side surface (122) and an array of chip attach sites (124), each of said chip attach sites comprising a portion of said second side surface, said chip attach sites being arranged in a second pattern and being directly electrically interconnected by interconnections (30) to input/output pads on said at least one semiconductor device (28), said chip attach sites disposed opposite said input/output pads, and a plurality of electrically isolated routing circuits (26) each having a surface comprising a portion of said second side surface and coplanar with the chip attach sites (124), electrically interconnecting individual combinations of said array of lands (14) and said array of chip attach sites (124);

a first molding compound (18), disposed at said first side of said lead frame and between individual lands of said array of lands (14), having a surface recessed with respect to said first side surface (121); and a second molding compound (36) encapsulating said at least one semiconductor device (28), said array of chip attach sites (124) and said routing circuits (26), wherein the lands and chip attach sites are formed from a monolithic electrically conductive structure, the array of lands (14) has a lateral extent greater than or equal to that of the array of chip attach sites (124), and the second molding compound does not extend to the first side of the lead frame.

12. The package (138) of claim 11 wherein said lead frame and said routing circuits (26) are elements of a single electrically conductive substrate (10).

13. The package (138) of claim 12 wherein said single electrically conductive substrate (10) is copper or a copper-base alloy.

14. The package (138) of claim 12 wherein a first perimeter defined by said array of lands (14) does not exceed a second perimeter defined by said at least one semiconductor device (28).

15. The package (138) of claim 14 being a chip scale package.

16. The package (138) of claim 12 further including a heat sink (42) that is a single electrically conductive substrate with said lead frame and coplanar with said array of lands (14).

17. The package (138) of claim 12 further including a die pad (44) for bonding one of said at least one semiconductor devices (28), said die pad (44) being monolithic with said lead frame.

18. The package (138) of claim 12 further including bond sites for bonding a passive device (52), said bond sites being monolithic with said lead frame.

19. The package (138) of claim 12 wherein a distance (32) between said at least one semiconductor device (28) and said routing circuits (26) is at least 25 microns and a space defined by said distance (32) is filled with said second molding compound (36).

20. The package (138) of claim 11 wherein at least one land in said array of lands (14) includes at least one of solder paste, Sn, Ag, Au, and NiAu.

21. A package (38) for encasing at least one semiconductor device (28), comprising:

a lead frame including an electrically conductive substrate and having opposing first and second sides, said first side of said lead frame having a planar first side surface and an array of lands (14), a surface of each of said lands comprising a portion of said first side surface, said lands adapted to be bonded to external circuitry and being arranged in a first pattern, and said second side of said lead frame having a planar second side surface and an array of chip attach sites (24), each of said chip attach sites protruding from said second side surface, said chip attach sites being arranged in a second pattern and being directly electrically interconnected by interconnections (30) to input/output pads on said at least one semiconductor device (28), said chip attach sites disposed opposite said input/output pads, and a plurality of electrically isolated routing circuits (26) each having a surface comprising a portion of said second side surface and electrically interconnecting individual combinations of said array of lands (14) and said array of chip attach sites (24);

a first molding compound (18) disposed on said first side surface and between individual lands of said array of lands (14), having a surface comprising a portion of said first side surface; and a second molding compound (36) encapsulating said at least one semiconductor device (28), said array of chip attach sites (24) and said routing circuits (26), wherein the lands and chip attach sites are formed from a monolithic electrically conductive structure, and the array of lands (14) has a lateral extent greater than or equal to that of the array of chip attach sites (24).

22. The package (38) of claim 21 wherein said lead frame and said routing circuits (26) are elements of a single electrically conductive substrate (10).

23. The package (38) of claim 22 wherein said single electrically conductive substrate (10) is copper or a copper-base alloy.

24. The package (38) of claim 22 wherein a first perimeter defined by said array of lands (14) does not exceed a second perimeter defined by said at least one semiconductor device (28).

25. The package (38) of claim 24 being a chip scale package.

26. The package (38) of claim 22 further including a heat sink (42) that is a single electrically conductive substrate with said lead frame and coplanar with said array of lands (14).

27. The package (38) of claim 22 further including a die pad (44) for bonding one of said at least one semiconductor devices (28), said die pad (44) being monolithic with said lead frame.

28. The package (38) of claim 22 further including bond sites for bonding a passive device (52), said bond sites being monolithic with said lead frame.

29. The package (38) of claim 22 wherein a distance (32) between said at least one semiconductor device (28) and said routing circuits (26) is at least 25 microns and a space defined by said distance (32) is filled with said second molding compound (36).

30. The package (38) of claim 22 wherein a distance (32) between said at least one semiconductor device (28) and said routing circuits (26) is at least 75 microns and a space defined by said distance (32) is filled with said second molding compound (36).

31. The package (38) of claim 30 wherein said distance (32) is from about 100 microns to about 150 microns.

32. The package (38) of claim 21 wherein at least one land in said array of lands (14) includes at least one of solder paste, Sn, Ag, Au, and NiAu.

33. A package (38) for encasing at least one semiconductor device (28), comprising:

a lead frame including an electrically conductive substrate and having opposing first and second sides, said first side of said lead frame having a planar first side surface and an array of lands (14), a surface of each of said lands comprising a portion of said first side surface, said lands adapted to be bonded to external circuitry and being arranged in a first pattern, and said second side of said lead frame having a planar second side surface and an array of chip attach sites (24), each of said chip attach sites protruding from said second side surface, said chip attach sites being arranged in a second pattern and being directly electrically interconnected by interconnections (30) to input/output pads on said at least one semiconductor device (28), said chip attach sites disposed opposite said input/output pads, and a plurality of electrically isolated routing circuits (26) each having a surface comprising a portion of said second side surface, electrically interconnecting individual combinations of said array of lands (14) and said array of chip attach sites (24);

a first molding compound (18) disposed on said first side surface and between individual lands of said array of lands (14), having a surface recessed with respect to said first side surface; and a second molding compound (36) encapsulating said at least one semiconductor device (28), said array of chip attach sites (24) and said routing circuits (26), wherein the lands and chip attach sites are formed from a monolithic electrically conductive structure, and the array of lands (14) has a lateral extent greater than or equal to that of the array of chip attach sites (24).

34. The package (38) of claim 33 wherein said lead frame and said routing circuits (26) are elements of a single electrically conductive substrate (10).

35. The package (38) of claim 34 wherein said single electrically conductive substrate (10) is copper or a copper-base alloy.

36. The package (38) of claim 34 wherein a first perimeter defined by said array of lands (14) does not exceed a second perimeter defined by said at least one semiconductor device (28).

37. The package (38) of claim 36 being a chip scale package.

38. The package (38) of claim 34 further including a heat sink (42) that is a single electrically conductive substrate with said lead frame and coplanar with said array of lands (14).

39. The package (38) of claim 34 further including a die pad (44) for bonding one of said at least one semiconductor devices (28), said die pad (44) being monolithic with said lead frame.

40. The package (38) of claim 34 further including bond sites for bonding a passive device (52), said bond sites being monolithic with said lead frame.

41. The package (38) of claim 34 wherein a distance (32) between said at least one semiconductor device (28) and said routing circuits (26) is at least 25 microns and a space defined by said distance (32) is filled with said second molding compound (36).

42. The package (38) of claim 34 wherein a distance (32) between said at least one semiconductor device (28) and said routing circuits (26) is at least 75 microns and a space defined by said distance (32) is filled with said second molding compound (36).

43. The package (38) of claim 42 wherein said distance (32) is from about 100 microns to about 150 microns.

44. The package (38) of claim 33 wherein at least one land in said array of lands (14) includes at least one of solder paste, Sn, Ag, Au, and NiAu.

45. A package (238, 248) for encasing at least one semiconductor device (228), comprising:

a lead frame including an electrically conductive substrate and having opposing first and second sides, said first side of said lead frame having a planar first side surface (221) and an array of lands (14), a surface of each of said lands comprising a portion of said first side surface, said lands adapted to be bonded to external circuitry and being arranged in a first pattern, and said second side of said lead frame having a planar second side surface (222) facing opposite said at least one semiconductor device and an array of wirebonding sites (224), each of said wirebonding sites comprising a portion of said second side surface, said wirebonding sites being arranged in a second pattern and being electrically interconnected to input/output pads on said at least one semiconductor device (228); and a plurality of electrically isolated routing circuits (226) each having a surface comprising a portion of said second side surface and coplanar with the wirebonding sites (224), electrically interconnecting individual combinations of said array of lands (14) and said array of wirebonding sites (224);

a first molding compound (18), disposed at said first side of said lead frame and between individual lands of said array of lands (14); and a second molding compound (36) encapsulating said at least one semiconductor device (228), said array of wirebonding sites (224) and said routing circuits (226), wherein the lands and wirebonding sites are formed from a monolithic electrically conductive structure, the array of lands (14) has a lateral extent greater than or equal to that of the array of wirebonding sites (224), and the second molding compound does not extend to the first side of the lead frame.

46. The package (238, 248) of claim 45 wherein said lead frame and said routing circuits (226) are elements of a single electrically conductive substrate (10).

47. The package (238, 248) of claim 46 wherein said single electrically conductive substrate (10) is copper or a copper-base alloy.

48. The package (238, 248) of claim 46 wherein a first perimeter defined by said array of lands (14) does not exceed a second perimeter defined by said at least one semiconductor device (228).

49. The package (238, 248) of claim 45 wherein the first molding compound has a surface comprising a portion of said first side surface (221).

50. The package (238, 248) of claim 45 wherein the first molding compound has a surface recessed with respect to said first side surface (221).

51. The package (238) of claim 46 further including a heat sink (42) that is a single electrically conductive substrate with said lead frame and coplanar with said array of lands (14).

52. The package (238) of claim 46 further including a die pad (225) for bonding one of said at least one semiconductor devices (228), said die pad (225) being monolithic with said lead frame.

53. The package (238) of claim 52 wherein said die pad (225) is coplanar with said routing circuits (226) and has a surface comprising a portion of said second side surface (222).

54. The package (248) of claim 46, further comprising an electrically non-conductive layer (230) disposed on at least part of the second side surface (222), so that said wirebonding sites (224) are not covered by the non-conductive layer while at least one of the routing circuits (226) extends beneath the non-conductive layer.

55. The package (248) of claim 54, wherein said at least one semiconductor device (228) is disposed on the non-conductive layer (230).

56. The package (248) of claim 55, wherein at least one of the lands (14) in said first pattern is located on the first side surface in a portion thereof corresponding to a portion of the second side surface covered by the semiconductor device (228), so that at least one electrical conductor extends from the first side surface to the second side surface beneath the semiconductor device and electrically connects to the routing circuit extending beneath the non-conductive layer.

57. The package (238, 248) of claim 45 wherein at least one land in said array of lands (14) includes at least one of solder paste, Sn, Ag, Au, and NiAu.

58. The package (238, 248) of claim 45 wherein at least one of said wirebonding sites (224) includes at least one of Ag, NiPdAu, and NiAu.

* * * * *